US006590408B1

(12) United States Patent
Cheng et al.

(10) Patent No.: US 6,590,408 B1
(45) Date of Patent: Jul. 8, 2003

(54) MICROELECTRONIC FABRICATION ELECTRICAL TEST APPARATUS AND METHOD PROVIDING ENHANCED ELECTRICAL TEST ACCURACY

(75) Inventors: Yung-Min Cheng, Yungkang (TW); Chun-Sheng Wang, Shan-Hua (TW); Ming-Hui Lin, Tainan (TW); Sheng-Guei Chang, Tainan (TW); Juei-Feng Hsu, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/157,557

(22) Filed: May 29, 2002

(51) Int. Cl.[7] .................................................. G01R 31/02
(52) U.S. Cl. ...................................... 324/764; 324/73.1
(58) Field of Search ................................ 324/73.1, 754, 324/758, 763, 764, 765, 158.1; 714/724

(56) References Cited

U.S. PATENT DOCUMENTS

| 4,517,512 | A | * | 5/1985 | Petrich et al. ............... 714/724 |
| 5,206,582 | A | * | 4/1993 | Ekstedt et al. .............. 324/73.1 |
| 6,268,740 | B1 | * | 7/2001 | Iida ............................ 324/765 |
| 6,304,095 | B1 | | 10/2001 | Miyamoto |

* cited by examiner

Primary Examiner—Kamand Cuneo
Assistant Examiner—Minh N. Tang
(74) Attorney, Agent, or Firm—Tung & Associates

(57) ABSTRACT

Within both an electrical test apparatus for electrically testing a substrate, and a method for electrically testing the substrate while employing the electrical test apparatus, there is provided for an automatic selection of an electrical test program, absent operator intervention, once having identified a substrate. Due to the absence of operator intervention, the substrate is more accurately electrically tested.

10 Claims, 2 Drawing Sheets

MICROELECTRONIC FABRICATION ELECTRICAL TEST APPARATUS AND METHOD PROVIDING ENHANCED ELECTRICAL TEST ACCURACY

BACKGROUND OF THE INVENTION

1. Field of the Invention

The present invention relates generally to apparatus and methods for electrically testing microelectronic fabrications. More particularly, the present invention relates to apparatus and methods for accurately electrically testing microelectronic fabrications.

2. Description of the Related Art

Integral to the fabrication of microelectronic fabrications, and in particular to the fabrication of semiconductor integrated circuit microelectronic fabrications, is the electrical testing of microelectronic fabrications. The electrical testing of microelectronic fabrications may occur: (1) during various stages incident to the ongoing fabrication of microelectronic fabrication substrates, as is generally understood to encompass in-line electrical testing of microelectronic fabrications; as well as (2) subsequent to completion of fabrication of microelectronic fabrication substrates, as is generally understood to encompass final electrical testing of microelectronic fabrications. Within either in-line electrical testing of microelectronic fabrications or final electrical testing of microelectronic fabrications there is typically employed an electrical test apparatus and method which provide for electrically testing various microelectronic devices and/or various microelectronic circuits, generally within a plurality of microelectronic fabrication die derived from a microelectronic fabrication substrate.

While in-line electrical testing of microelectronic fabrications and final electrical testing of microelectronic fabrications while employing electrical test apparatus and methods are both of considerable interest and of considerable importance to the goal of fabricating fully functional and fully reliable microelectronic fabrications, both in-line electrical testing of microelectronic fabrications and final electrical testing of microelectronic fabrications are nonetheless not entirely without problems with respect to the goal of fabricating fully functional and fully reliable microelectronic fabrications. In that regard, both in-line electrical testing of microelectronic fabrications and final electrical testing of microelectronic fabrications are often not entirely accurate when fabricating microelectronic fabrications.

It is thus desirable in the art of microelectronic fabrication to provide electrical test apparatus and methods for more accurately electrically testing microelectronic fabrications.

It is towards the foregoing object that the present invention is directed.

Various apparatus, systems and methods for electrically testing microelectronic fabrications, such as to realize desirable results, have been disclosed in the art of microelectronic fabrication.

Included among the methods, systems and apparatus, but not limited among the methods, systems and apparatus, are methods, systems and apparatus disclosed within Miyamoto, in U.S. Pat. No. 6,304,095 (an electrical test apparatus with an ability to dynamically change test criteria when electrically testing a microelectronic fabrication such as to more efficiently test the microelectronic fabrication).

Desirable in the art of microelectronic fabrication are additional electrical test apparatus and methods which may be employed for more accurately testing microelectronic fabrications.

It is towards the foregoing object that the present invention is directed.

SUMMARY OF THE INVENTION

A first object of the present invention is to provide an electrical test apparatus and an electrical test method for electrically testing a microelectronic fabrication.

A second object of the present invention is to provide an electrical test apparatus and an electrical test method in accord with the first object of the present invention, wherein the microelectronic fabrication is accurately electrically tested.

A third object of the present invention is to provide an electrical test apparatus and an electrical test method in accord with the first object of the present invention and the second object of the present invention, wherein the electrical test apparatus is readily fabricated and the electrical test method is readily commercially implemented.

In accord with the objects of the present invention, the present invention provides an electrical test apparatus and an electrical test method for electrically testing a microelectronic fabrication.

In accord with the present invention, the electrical test apparatus comprises an electrical test apparatus controller. The electrical test apparatus also comprises a data storage means associated with the electrical test apparatus controller, where the data storage means provides for storage of a library of electrical test programs corresponding with a plurality of substrates which may be electrically tested with the electrical test apparatus. The electrical test apparatus also comprises a substrate identification means also associated with the electrical test apparatus controller. Within the electrical test apparatus, the electrical test apparatus controller is programmed to: (1) accept from the substrate identification means identification information for a substrate within the plurality of substrates which may be electrically tested with the electrical test apparatus; and (2) absent operator intervention to automatically select a corresponding electrical test program within the library of electrical test programs for electrically testing the substrate within the plurality of substrates which may be electrically tested with the electrical test apparatus.

The electrical test apparatus of the present invention contemplates a method for testing a microelectronic fabrication while employing the electrical test apparatus of the present invention.

The present invention provides an electrical test apparatus and method for electrically testing a microelectronic fabrication, wherein the microelectronic fabrication is accurately electrically tested.

The present invention realizes the foregoing object by providing an electrical test apparatus comprising: (1) an electrical test apparatus controller; (2) a data storage means associated with the electrical test apparatus controller, where the data storage means provides for storage of a library of electrical test programs corresponding with a plurality of substrates which may be electrically tested with the electrical test apparatus; and (3) a substrate identification means also associated with the electrical test apparatus controller, where the electrical test apparatus controller is programmed to: (1) accept from the substrate identification means identification information for a substrate within the plurality of substrates which may be electrically tested with the electrical test apparatus; and (2) absent operator intervention to automatically select a corresponding electrical test program within the library of electrical test programs for electrically testing the substrate within the plurality of substrates which may be electrically tested with the electrical test apparatus. By automatically selecting the electrical test program absent operator intervention, the electrical test apparatus of the present invention, and its associated electrical test method, provide for more accurately testing a microelectronic fabrication.

The apparatus of the present invention is readily fabricated and the method of the present invention is readily commercially implemented. The present invention employs components, apparatus and systems as are generally known in the art of microelectronic fabrication, but assembled and programmed in a fashion such as to provide the present invention. Since it is thus at least in part an assembly and programming of a series of components, apparatus and systems which provides the present invention, rather than the existence of components, apparatus and systems which provides the present invention, the apparatus of the present invention is readily fabricated and the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides an electrical test apparatus and method for electrically testing a microelectronic fabrication, wherein the microelectronic fabrication is accurately electrically tested.

The present invention realizes the foregoing object by providing an electrical test apparatus comprising: (1) an electrical test apparatus controller; (2) a data storage means associated with the electrical test apparatus controller, where the data storage means provides for storage of a library of electrical test programs corresponding with a plurality of substrates which may be electrically tested with the electrical test apparatus; and (3) a substrate identification means also associated with the electrical test apparatus controller, where the electrical test apparatus controller is programmed to: (1) accept from the substrate identification means identification information for a substrate within the plurality of substrates which may be electrically tested with the electrical test apparatus; and (2) absent operator intervention to automatically select a corresponding electrical test program within the library of electrical test programs for electrically testing the substrate within the plurality of substrates which may be electrically tested with the electrical test apparatus. By automatically selecting the electrical test program absent operator intervention, the electrical test apparatus of the present invention, and its associated electrical test method, provide for more accurately testing a microelectronic fabrication.

Although the present invention and preferred embodiment of the present invention provide particular value when electrically testing, with enhanced accuracy, a series of semiconductor integrated circuit microelectronic fabrication die within a semiconductor substrate, the present invention is not so limited. Rather, the present invention may be employed for electrically testing, with enhanced accuracy, various series of microelectronic fabrications fabricated within various microelectronic substrates, including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
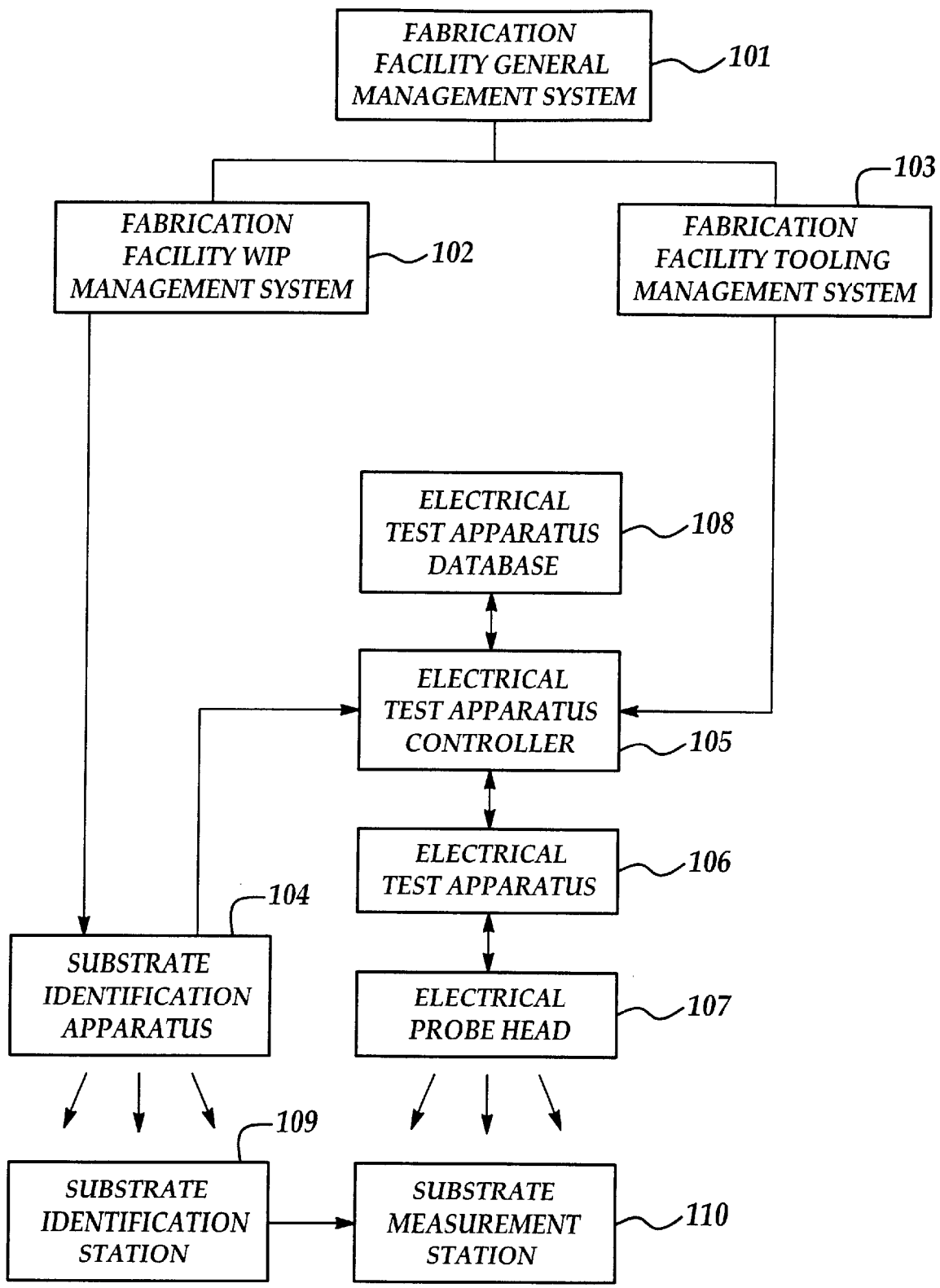
FIG. 1 shows a schematic block diagram of a fabrication facility having therein an electrical test apparatus in accord with the present invention.

Referring now to FIG. 1, there is shown a schematic block diagram of a fabrication facility having therein an electrical test apparatus in accord with the present invention.

Shown in FIG. 1 is a fabrication facility general management system 101, which is typically a computer assisted system or a computer operated system. The fabrication facility general management system 101 in turn manages both a fabrication facility work in process (WIP) workload management system 102 within a fabrication facility and a fabrication facility tooling management system 103 within the fabrication facility.

As is further illustrated within the schematic block diagram of FIG. 1 the fabrication facility work in process (WIP) management system 102 has associated therewith a substrate identification apparatus 104 (and generally multiple substrate identification apparatus such as the substrate identification apparatus 104). The substrate identification apparatus 104 (which may alternatively be referred to as a substrate identification means) is typically a barcode reader, although other substrate identification apparatus, such as electromechanical substrate identification apparatus, may also be employed within the context of the present invention. Within the present invention, the substrate identification apparatus 104 may identify an individual substrate to be electrically tested or processed within a fabrication facility. In an alternative, the substrate identification apparatus 104 more typically identifies a substrate carrier within which is carried a substrate, or a plurality of substrates, which are to be electrically tested or processed within a fabrication facility.

Within the preferred embodiment of the electrical test apparatus of the present invention, both the substrate identification apparatus 104 and the fabrication facility tooling management system 103 provide input to an electrical test apparatus controller 105. The electrical test apparatus controller 105 is typically also a computer assisted apparatus or controller. The electrical test apparatus controller 105 in turn operates an electrical test apparatus 106 having assembled thereto an electrical probe head 107.

Within the present invention, the electrical test apparatus controller 106, in addition to being associated with and receiving input from the substrate identification apparatus 104 and the fabrication facility tooling management system 103, also has associated therewith an electrical test apparatus database 108 (i.e., a storage means within the context of the present invention) which stores: (1) electrical test data from electrically tested substrates; as well as (2) a library of test programs for testing a series of substrates which may be electrically tested while employing the electrical test apparatus of the present invention.

Within the present invention, the electrical test apparatus controller 105, upon receiving from the substrate identification apparatus 104 identification information for a substrate to be electrically tested within the electrical test apparatus of the present invention automatically and absent operator intervention selects from the electrical test apparatus database 108 the appropriate electrical test program for electrically testing the substrate. Due to the absence of operator intervention, the substrate (or more commonly microelectronic die fabricated therein) is more accurately electrically tested since operator error is avoided with regard to electrical test program selection within the electrical test apparatus of the present invention.

Finally, there is also shown within the schematic block diagram of FIG. 1: (1) a substrate identification station 109 within the electrical test apparatus of the present invention juxtaposed with the substrate identification apparatus 104; and (2) a substrate measurement station within the electrical test apparatus of the present invention juxtaposed with the electrical probe head 110. In operation of the electrical test apparatus of the present invention, a substrate is first identified at the substrate identification station 109 through action of the substrate identification apparatus 104. Similarly, the substrate is then electrically tested at the substrate measurement station 110 through action of the electrical probe head 107 of the electrical test apparatus. While the preferred embodiment of the present invention illustrates the substrate identification station 109 and the substrate measurement station 110 as independent and separated stations, a single multi-purpose station may be employed to serve both purposes.

Within the present invention, the electrical probe head 107 may comprise electrical contact probe heads and electrical non-contact probe heads as are otherwise conventional or unconventional in the art of microelectronic fabrication. Similarly, electrical testing of a substrate in accord with the present invention may be directed towards testing electrical parameters as are conventional or unconventional in the art of microelectronic fabrication, such as but not limited to electrical shorts, electrical opens, circuit resistances and breakdown voltages.

Figure 2:
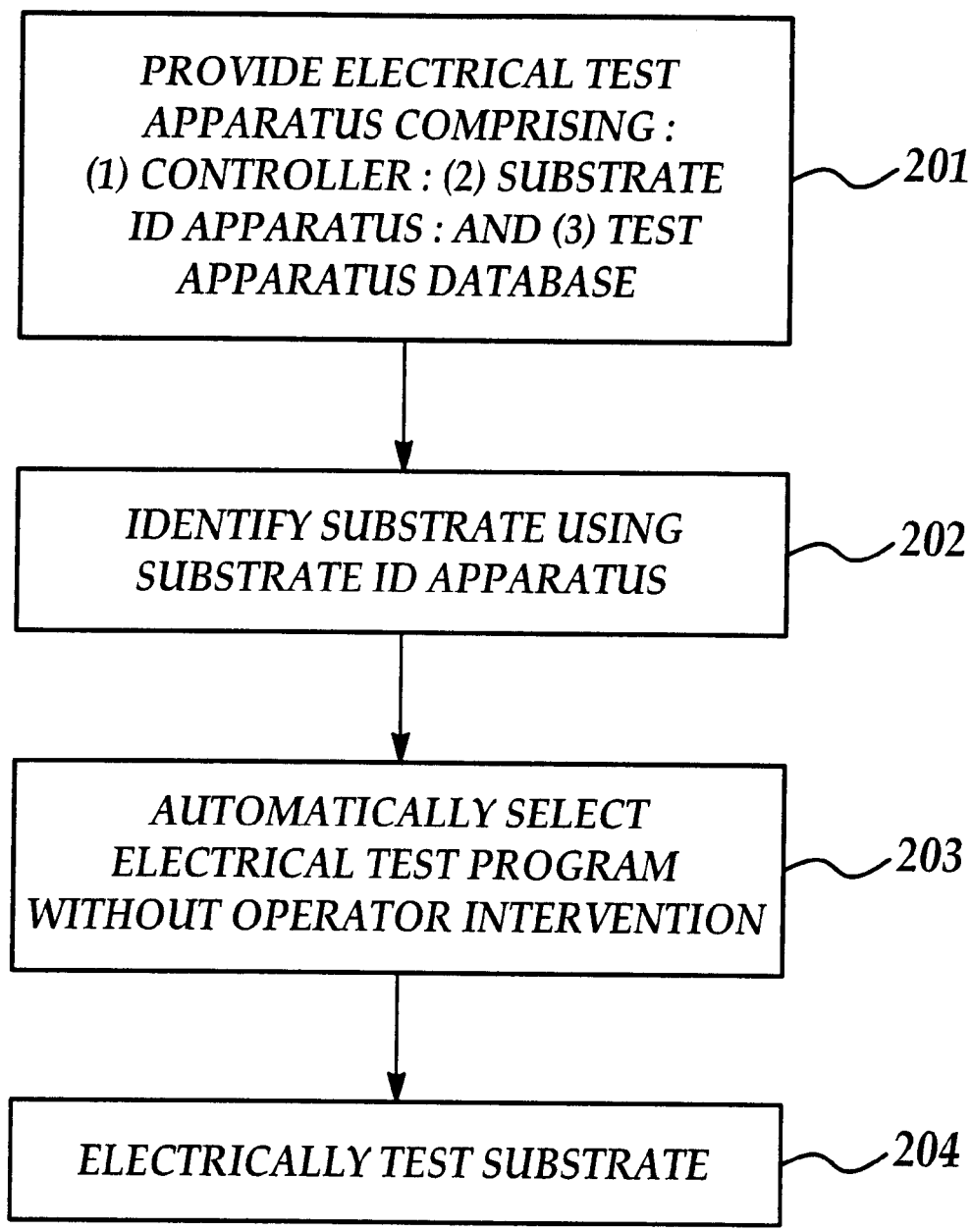
FIG. 2 shows a process flow diagram of an electrical test method in accord with the present invention employing the electrical test apparatus in accord with the present invention.

Referring now to FIG. 2, there is shown a schematic process flow diagram illustrating operation, in accord with a method of the present invention, of the electrical test apparatus of the present invention.

Within the schematic process flow diagram of FIG. 2, and in accord with the process step which corresponds with reference numeral 201, there is first provided an electrical test apparatus in accord with the present invention, where the electrical test apparatus comprises: (1) a controller; (2) a substrate identification apparatus; and (3) an electrical test apparatus database, in accord with the electrical test apparatus controller 105, the substrate identification apparatus 104 and the electrical test apparatus database 108 of the preferred embodiment of the apparatus of the present invention as illustrated in FIG. 1.

Referring again to the schematic process flow diagram of FIG. 2, and in accord with the process step which corresponds with reference numeral 202, there is then identified a substrate for which electrical testing is desired, while employing the substrate identification apparatus component of the electrical test apparatus of the present invention.

Referring again to the schematic process flow diagram of FIG. 2, and in accord with the process step which corresponds with reference numeral 203, there is then automatically selected an electrical test program for electrically testing the substrate, without operator intervention, and while employing the electrical test apparatus controller.

Finally, referring again to the schematic process flow diagram of FIG. 2, and in accord with the process step which corresponds with reference numeral 204, the substrate is electrically tested while employing within the electrical test apparatus the electrical test program which was automatically selected, absent operator intervention.

As is understood by a person skilled in the art, the preferred embodiment of the present invention is illustrative of the present invention rather than limiting of the present invention. Revisions and modifications may be made to apparatus, systems and methods which are employed within the context of the preferred embodiment of the present invention while still providing an apparatus in accord with the present invention and a method in accord with the present invention, further in accord with the accompanying claims.

What is claimed is:

1. An electrical test apparatus comprising:

an electrical test apparatus controller;

a data storage means associated with the electrical test apparatus controller, where the data storage means provides for storage of a library of electrical test programs corresponding with a plurality of substrates which is electrically tested with the electrical test apparatus;

a substrate identification means also associated with the electrical test apparatus controller, where the electrical test apparatus controller is programmed to:

accept from the substrate identification means identification information for a substrate within the plurality of substrates which is electrically tested with the electrical test apparatus; and absent operator intervention to automatically select a corresponding electrical test program within the library of electrical test programs for electrically testing the substrate within the plurality of substrates which is electrically tested with the electrical test apparatus.

2. The electrical test apparatus of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The electrical test apparatus of claim 1 wherein the electrical test apparatus is a physical contact electrical test apparatus.

4. The electrical test apparatus of claim 1 wherein the electrical test apparatus is a physical non-contact electrical test apparatus.

5. The electrical test apparatus of claim 1 wherein the substrate identification means is a barcode reader.

6. A method for electrically testing a substrate comprising:

providing an electrical test apparatus comprising:

an electrical test apparatus controller;

a data storage means associated with the electrical test apparatus controller, where the data storage means provides for storage of a library of electrical test programs corresponding with a plurality of substrates which is electrically tested with the electrical test apparatus;

a substrate identification means also associated with the electrical test apparatus controller, where the electrical test apparatus controller is programmed to:

accept from the substrate identification means identification information for a substrate within the plurality of substrates which is electrically tested with the electrical test apparatus; and absent operator intervention to automatically select a corresponding electrical test program within the library of electrical test programs for electrically testing the substrate within the plurality of substrates which is electrically tested with the electrical test apparatus;

identifying with the substrate identification means a substrate to be electrically tested with the electrical test apparatus; and electrically testing the substrate while employing an electrical test program automatically selected, absent operator intervention.

7. The method of claim 6 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

8. The method of claim 6 wherein the electrical test apparatus is a physical contact electrical test apparatus.

9. The method of claim 6 wherein the electrical test apparatus is a physical non-contact electrical test apparatus.

10. The method of claim 6 wherein the substrate identification means is a barcode reader.

* * * * *